(12) United States Patent
Cai et al.

(10) Patent No.: US 9,875,977 B2
(45) Date of Patent: Jan. 23, 2018

(54) PACKAGING PROCESS OF ELECTRONIC COMPONENT

(71) Applicant: Delta Electronics Int'l (Singapore) Pte Ltd, Singapore (SG)

(72) Inventors: Qin-Jia Cai, Singapore (SG); Da-Jung Chen, Singapore (SG)

(73) Assignee: DELTA ELECTRONICS INT'L (SINGAPORE) PTE LTD, Singapore (SG)

(*) Notice: Subject to any disclaimer, the term of this patent is extended or adjusted under 35 U.S.C. 154(b) by 0 days.

(21) Appl. No.: 15/015,734

(22) Filed: Feb. 4, 2016

(65) Prior Publication Data
US 2016/0240498 A1 Aug. 18, 2016

(30) Foreign Application Priority Data
Feb. 13, 2015 (SG) .............................. 10201501172R

(51) Int. Cl.
*H01L 21/00* (2006.01)
*H01L 23/00* (2006.01)
(Continued)

(52) U.S. Cl.
CPC .......... *H01L 24/03* (2013.01); *H01L 21/4846* (2013.01); *H01L 23/3677* (2013.01); *H01L 23/5389* (2013.01); *H01L 24/19* (2013.01); *H01L 24/96* (2013.01); *H01L 21/56* (2013.01); *H01L 21/568* (2013.01); *H01L 23/3121* (2013.01); *H01L 2224/02317* (2013.01); *H01L 2224/0361* (2013.01);
(Continued)

(58) Field of Classification Search
CPC . H01L 21/4871; H01L 21/4882; H01L 23/36; H01L 23/3733; H01L 21/4814; H01L 23/043; H01L 23/3164; H01L 23/053; H01L 23/08; H01L 23/291; H01L 23/293; H01L 23/49586
See application file for complete search history.

(56) References Cited

U.S. PATENT DOCUMENTS 8,987,900 B2 * 3/2015 Kim ...................... H01L 23/295
257/737
2013/0075924 A1 * 3/2013 Lin ......................... H01L 24/19
257/774
(Continued)

*Primary Examiner* — Sonya D McCall Shepard
(74) *Attorney, Agent, or Firm* — Kirton McConkie; Evan R. Witt

(57) ABSTRACT

A packaging process of an electronic component includes the following steps. Firstly, a semi-package unit is provided. The semi-package unit includes a first insulation layer and an electronic component. The electronic component is partially embedded within the first insulation layer. The electronic component includes at least one conducting terminal. Then, a metal layer is formed over the surface of the semi-package unit and a part of the metal layer is removed, so that a metal mask is formed on the surface of the semi-package unit and the at least one conducting terminals is exposed. Then, a metal re-distribution layer is formed on the metal mask and the at least one conducting terminal. Then, a part of the metal re-distribution layer and a part of the metal mask are removed, so that at least one contact pad corresponding to the at least one conducting terminal is produced.

9 Claims, 8 Drawing Sheets

(51) Int. Cl.
*H01L 23/367* (2006.01)
*H01L 21/48* (2006.01)
*H01L 23/538* (2006.01)
H01L 21/56 (2006.01)
H01L 23/31 (2006.01)

(52) U.S. Cl.
CPC ............... *H01L 2224/0362* (2013.01); *H01L 2224/0381* (2013.01); *H01L 2224/03622* (2013.01); *H01L 2224/04105* (2013.01); *H01L 2224/05024* (2013.01); *H01L 2224/05025* (2013.01); *H01L 2924/19105* (2013.01)

(56) References Cited

U.S. PATENT DOCUMENTS

2013/0228917 A1* 9/2013 Yoon .................. H01L 23/49811
257/737
2013/0320525 A1* 12/2013 Lin .................... H01L 23/49811
257/737

* cited by examiner

PACKAGING PROCESS OF ELECTRONIC COMPONENT

FIELD OF THE INVENTION

The present invention relates to a packaging process, and more particularly to a packaging process of an electronic component.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single electronic module. For example, a power module is one of the widely-used electronic modules. An example of the power module includes but is not limited to a DC-to-DC converter, a DC-to-AC converter or an AC-to-DC converter. After the electronic components (e.g. capacitors, resistors, inductors, transformers, diodes and transistors) are integrated as a power module, the power module may be installed on a motherboard or a system circuit board.

Nowadays, an embedded package structure is widely adopted because of many advantages such as smaller footprint, lower profile, higher power density and performance, better thermal management, lower electrical noise and mass production. A conventional embedded package structure will be illustrated as follows. In the embedded package structure, an electronic component with at least one conducting terminal is disposed on a first surface of a substrate, and a first insulation layer is disposed on the first surface of the substrate. If necessary, a second insulation layer is disposed on a second surface of the substrate. Consequently, the electronic component is covered by the first insulation layer. For allowing the conducting terminal to be connected with an external circuit, at least one conductive via is formed in the first insulation layer. Consequently, the conducting terminal of the electronic component may be connected with the external circuit through the conductive via.

As mentioned above, for allowing the conducting terminal of the embedded electronic component to be connected with the external circuit, the conductive via is formed in the first insulation layer. During the formation of the conductive via, a cleaning process with the chemical agent is performed after the via hole is drilled. Since copper has excellent resistance to the laser drilling process, the conducting terminal of the electronic component of the embedded package structure is usually made of copper. In other words, the possibility of causing damage of the insulation layer during the laser drilling process will be minimized. Moreover, since copper has excellent resistance to the chemical agent, the possibility of causing corrosion by the chemical agent will be minimized. Moreover, the native oxide layer on the copper surface is easily removed by etching process.

However, since the conducting terminal of the embedded electronic component of the package structure is made of copper, the type of the electronic component is restricted. If the conducting terminal is made of a non-copper metallic material, the electronic component cannot be directly embedded within the package structure. In particular, if the conducting terminal of the electronic component is made of the non-copper metallic material and the electronic component needs to be embedded in the package structure, the conducting terminal of the electronic component should be firstly treated and then covered by a copper layer, e.g. Cu RDL. Currently, Cu RDL is generally carried out in a wafer-level, which shows specific requirements on wafer thickness for safe wafer-handling. Usually, the staring wafer starts from at least 400 um in thickness to avoid the wafer crack during the wafer processing.

Therefore, there is a need of providing an improved packaging process of an electronic component in order to eliminate the above drawbacks.

SUMMARY OF THE INVENTION

An object of the present invention provides a packaging process of an electronic component, in which the conducting terminals of the electronic component are made of a non-copper metallic material. Since the type of the electronic component is not stringently limited, the applications of the package structure by the packaging process are more extensive.

Another object of the present invention provides a packaging process of an electronic component. By this packaging process, plural panel-level contact pads are formed on the conducting terminals of the electronic component. Due to the panel-level contact pads, the subsequent steps of the embedded package structure (e.g. the laminating process, the laser drilling process, the desmearing process and the blind via plating process) can be done subsequently.

An aspect of the present invention provides a packaging process of an electronic component. Firstly, a semi-package unit is provided. The semi-package unit includes a first insulation layer and an electronic component. The electronic component is partially embedded within the first insulation layer. The electronic component includes at least one conducting terminal disposed on a surface of the semi-package unit without being covered by the first insulation layer. Then, a metal layer is formed over the surface of the semi-package unit and a part of the metal layer is removed, so that a metal mask is formed on the surface of the semi-package unit and the at least one conducting terminal uncovered by the metal mask is exposed. Then, a metal re-distribution layer is formed on the metal mask and the at least one conducting terminal, so that the metal mask and the at least one conducting terminal are covered by and contacted with the metal re-distribution layer. Then, a part of the metal re-distribution layer and a part of the metal mask are removed, so that at least one contact pad corresponding to the at least one conducting terminal is produced.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1M are schematic cross-sectional views illustrating a packaging process of an electronic component according to a first embodiment of the present invention.

Figure 1A:
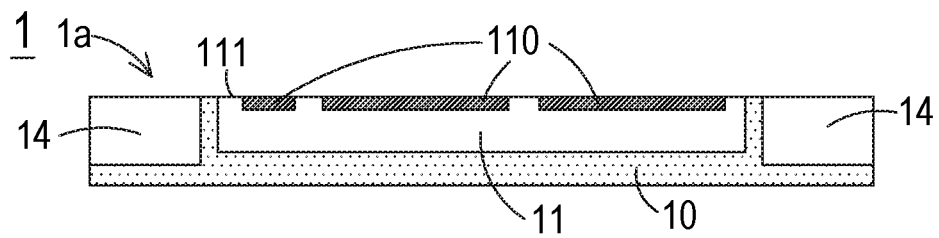
FIGS. 1A~1M are schematic cross-sectional views illustrating a packaging process of an electronic component according to a first embodiment of the present invention.

Firstly, as shown in FIG. 1A, a semi-package unit 1 is provided. The semi-package unit 1 comprises a first insulation layer 10 and an electronic component 11. In an embodiment, the first insulation layer 10 is made of resin or any other appropriate insulation material with high thermal conductivity. The electronic component 11 is partially embedded within the first insulation layer 10. Moreover, the electronic component 11 comprises at least one conducting terminal 110. The conducting terminal 110 is disposed on a surface 111 of the electronic component 11 and exposed to the first insulation layer 10. In other words, the conducting terminal 110 is disposed on a surface 1a of the semi-package unit 1. In this embodiment, the electronic component 11 comprises plural conducting terminals 110, and the plural conducting terminals 110 are made of aluminum, silver, gold, or any other appropriate metallic material, other than copper.

The electronic component 11 is an active component or a passive component. An example of the electronic component 11 includes but is not limited to an integrated circuit (IC) chip, an integrated power component, a metal-oxide-semiconductor field-effect transistor (MOSFET), a high electron mobility transistor (HEMT), an insulated-gate bipolar transistor (IGBT), a diode, a capacitor, a resistor, an inductor or a fuse. The number of the conducting terminals 110 of the electronic component 11 is determined according to the type and the configuration of the electronic component 11. As shown in FIG. 1A, the electronic component 11 is an integrated circuit (IC) chip. According to the configuration of the IC chip, the electronic component 11 has three conducting terminals 110.

In an embodiment, the semi-package unit 1 further comprises at least one thermal conduction structure 14. The thermal conduction structure 14 is embedded within the first insulation layer 10. Moreover, the thermal conduction structure 14 is located at least a side of the electronic component 11. For example, the thermal conduction structure 14 is arranged around the electronic component 11. Moreover, the thermal conduction structure 14 is partially exposed outside the first insulation layer 10. Consequently, the heat generated by the electronic component 11 may be transferred to the surroundings of the package structure through the thermal conduction structure 14. In some embodiments, the thermal conduction structure 14 is implemented by a metallic lead frame. In some other embodiments, the thermal conduction structure 14 is implemented by a PCB substrate or a ceramic substrate with a good thermally conductive property.

Figure 1B:
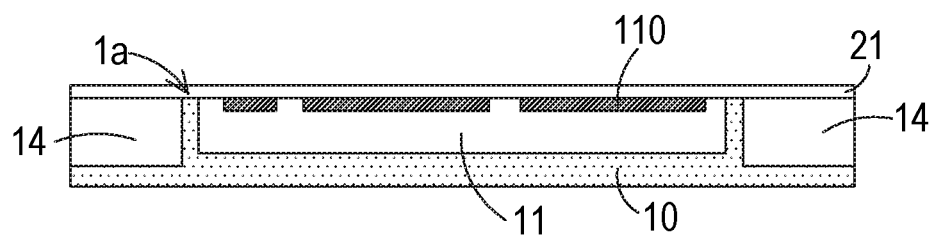

Then, as shown in FIG. 1B, a photoresist layer 21 is formed on the surface 1a of the semi-package unit 1 to cover the conducting terminals 110.

Figure 1C:
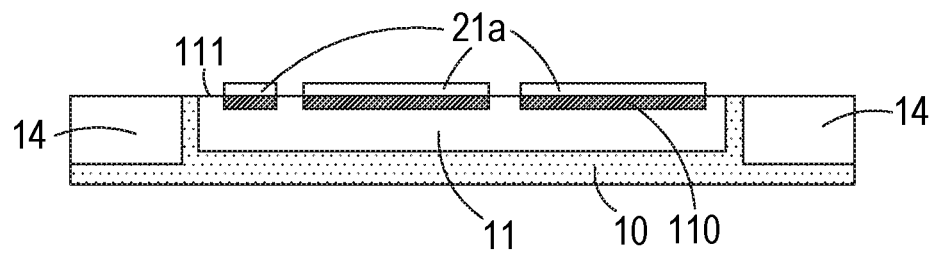

Then, as shown in FIG. 1C, exposure and developing processes are performed to remove a part of the photoresist layer 21 and define a patterned photoresist zone 21a with a photomask (not shown). Consequently, the conducting terminals 110 are covered by the patterned photoresist zone 21a while a part of the first insulation layer 10, a part of the surface 111 of the electronic component 11 and a part of the thermal conduction structure 14 are exposed.

Figure 1D:
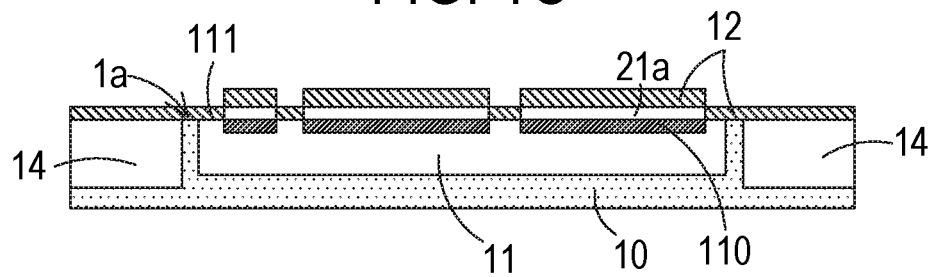

Then, as shown in FIG. 1D, a metal layer 12 is formed over the resulting structure of FIG. 1C to cover the patterned photoresist zone 21a, the first insulation layer 10, the surface 111 of the electronic component 11 and the thermal conduction structure 14. In an embodiment, the metal layer 12 is formed by depositing a metal layer, such as a copper (Cu) layer, a TiW/Cu layer, a NiCr/Cu layer or a combination thereof, over the resulting structure of FIG. 1C.

Figure 1E:
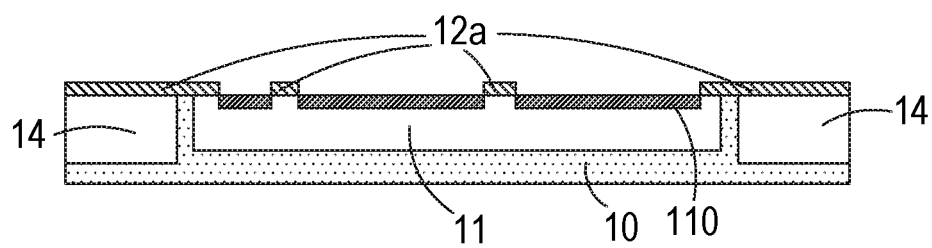

Then, as shown in FIG. 1E, the part of the metal layer 12 overlying the patterned photoresist zone 21a and the patterned photoresist zone 21a are sequentially removed by a lift-off process. Consequently, the metal layer 12 is formed as a metal mask 12a and the conducting terminals 110 are exposed. It is noted that the way of removing the part of the metal layer 12 and the patterned photoresist zone 21a is not restricted to the lift-off process.

Figure 1F:
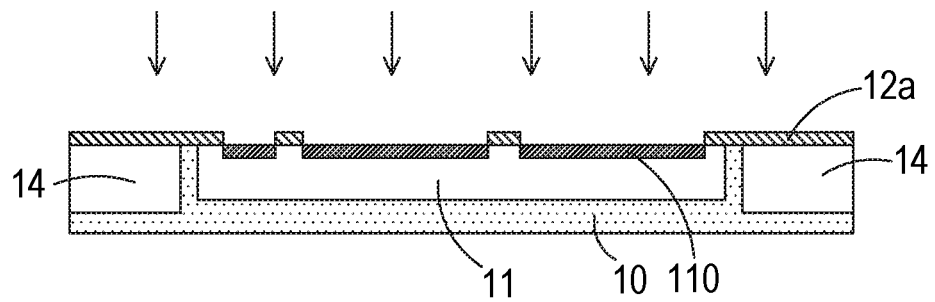

Then, as shown in FIG. 1F, the conducting terminals 110 uncovered by the metal mask 12a are subjected to a plasma cleaning process. Consequently, the native oxide material and the contaminant on the conducting terminals 110 are cleaned off. Moreover, the plasma cleaning process may be slightly modified according to the type of the metallic material of the conducting terminals 110.

Figure 1G:
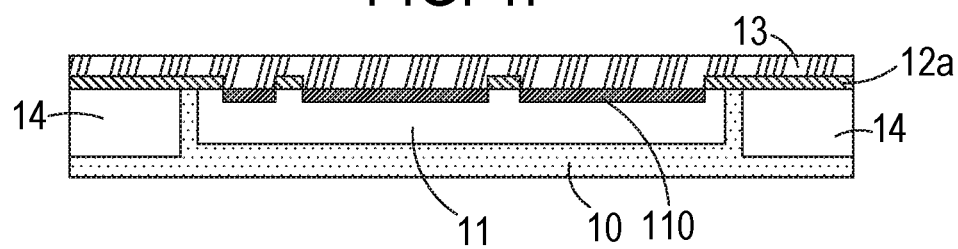

Then, as shown in FIG. 1G, a depositing process or an electroplating process is performed to form a metal re-distribution layer (also referred as Metal RDL) 13 on the metal mask 12a and the conducting terminals 110. Consequently, the metal mask 12a and the conducting terminals 110 are covered by and contacted with the metal re-distribution layer 13. An example of the metal re-distribution layer 13 is made of copper (Cu), TiW/Cu, NiCr/Cu or a copper-containing material. Preferably, the thickness of the metal re-distribution layer 13 is in the range between 2 μm and 15 μm. Moreover, the metal re-distribution layer 13 is a panel-level copper re-distribution layer (PLCR).

Figure 1H:
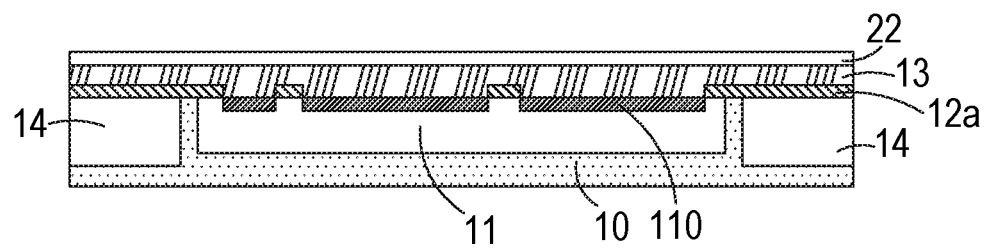

Then, as shown in FIG. 1H, a photoresist layer 22 is formed on the metal re-distribution layer 13.

Figure 1I:
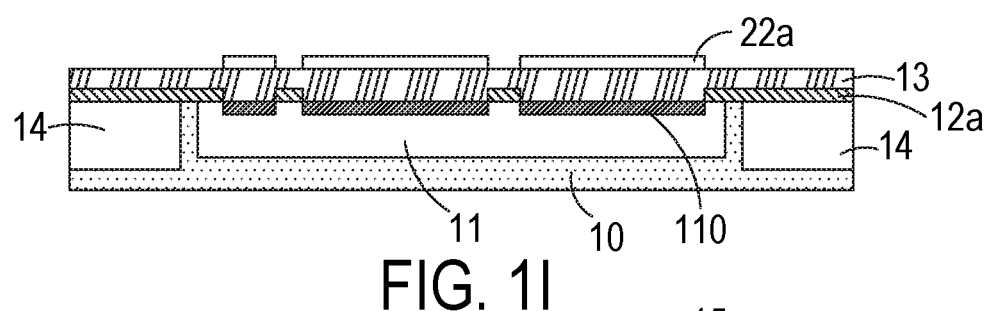

Then, as shown in FIG. 1I, exposure and developing processes are performed to define a patterned photoresist zone 22a with a photomask (not shown). Consequently, the part of the metal re-distribution layer 13 corresponding to the conducting terminals 110 is covered by the patterned photoresist zone 22a, and the rest of the metal re-distribution layer 13 is exposed.

Figure 1J:
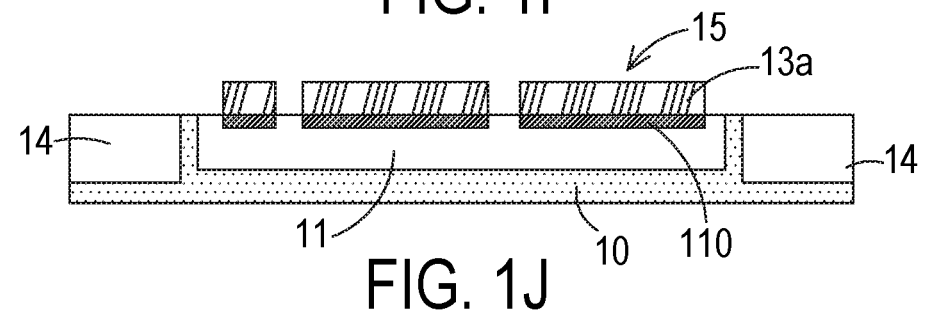

Then, as shown in FIG. 1J, the part of the metal re-distribution layer 13 and the part of the metal mask 12a uncovered by the patterned photoresist zone 22a are etched, while the part of the metal re-distribution layer 13 corresponding to the conducting terminals 110 is retained. After the patterned photoresist zone 22a is removed, plural contact pads 13a corresponding to the conducting terminals 110 are produced. In this embodiment, each of the conducting terminals 110 and the corresponding contact pad 13a are collaboratively defined as an electrode 15.

In an embodiment, the size and location of the contact pad 13a match the size and location of the corresponding conducting terminal 110. In another embodiment, the size of the contact pad 13a is smaller than the size of the corresponding conducting terminal 110. In another embodiment, the size of the contact pad 13a is larger than the size of the corresponding conducting terminal 110. In another embodiment, the location of the contact pad 13a is slightly deviated from the location of the corresponding conducting terminal 110.

Figure 1K:
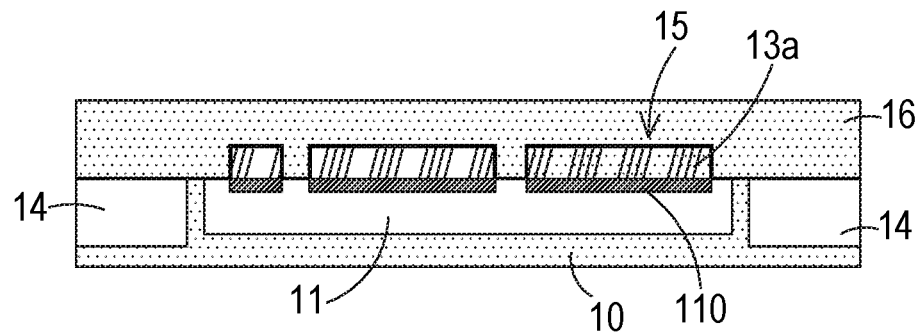

Then, as shown in FIG. 1K, a second insulation layer 16 is formed over the resulting structure of FIG. 1J by a laminating process or any other appropriate process. Consequently, the plural electrodes 15, the surface 111 of the electronic component 11, the first insulation layer 10, and the at least one thermal conduction structure 14 are covered by the second insulation layer 16. In an embodiment, the second insulation layer 16 is made of resin or any other appropriate insulation material with high thermal conductivity.

Figure 1L:
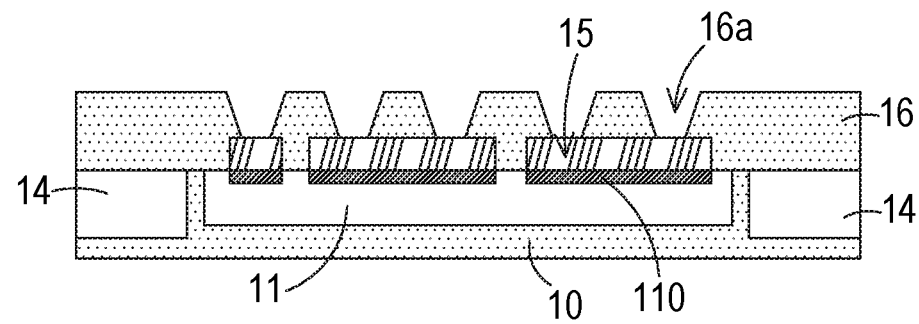

Then, as shown in FIG. 1L, a laser drilling process is performed to form plural openings 16a in the second insulation layer 16 at the locations corresponding to the electrodes 15 or the contact pads 13a. Then, a desmearing process is performed to remove the contaminant retained in the openings 16a. The electrodes 15 or the contact pads 13a run through the second insulation layer 16. Moreover, the electrodes 15 or the contact pads 13a are exposed through the corresponding openings 16a. In this embodiment, the number of the openings 16 is larger than or equal to the number of the electrodes 15.

Figure 1M:
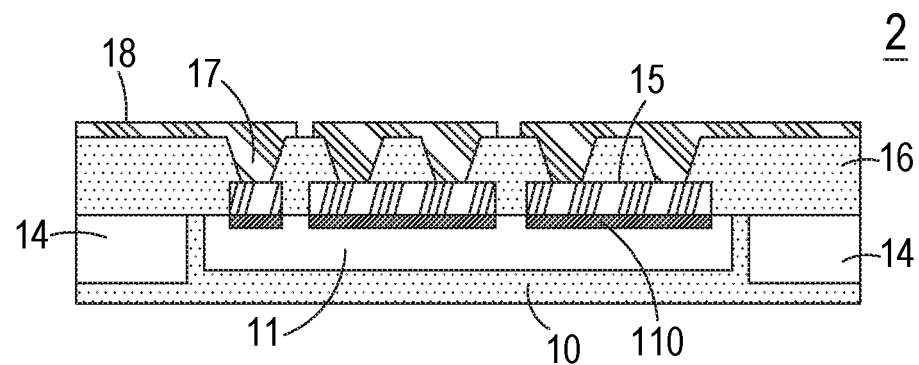

Then, as shown in FIG. 1M, a blind via plating process is performed to fill a conductive material in the openings 16a. Consequently, a metal line 18 is formed on the second insulation layer 16 and plural conductive vias 17 are formed in the second insulation layer 16. Consequently, the plural electrodes 15 are electrically connected with the metal line 18 through the plural conductive vias 17. Moreover, the electrodes 15 may be electrically connected with the external circuit (not shown) through the metal line 18. Meanwhile, a power module 2 with the embedded package structure is fabricated.

Figure 2A:
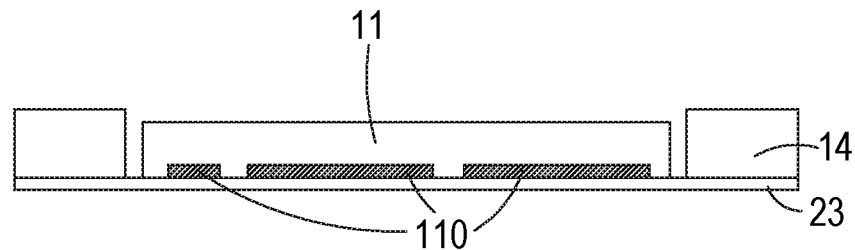
FIGS. 2A~2C are schematic cross-sectional views illustrating the process of fabricating the semi-package unit of FIG. 1A.
Figure 2B:
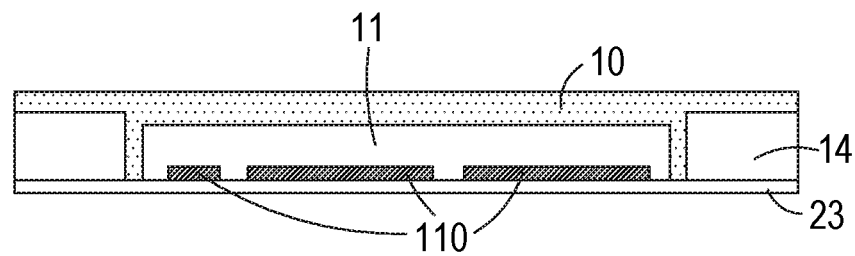
Figure 2C:
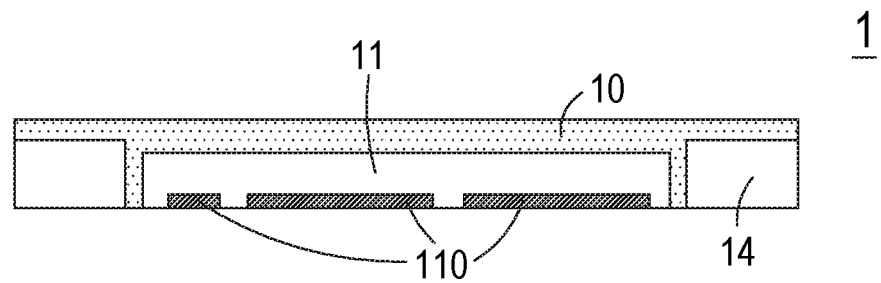

Hereinafter, a process of fabricating the semi-package unit 1 of FIG. 1A will be illustrated with reference to FIGS. 2A~2C. FIGS. 2A~2C are schematic cross-sectional views illustrating the process of fabricating the semi-package unit 1 of FIG. 1A. Firstly, as shown in FIG. 2A, a thermal release film 23, the electronic component 11 and the at least one thermal conduction structure 14 are provided. Then, the electronic component 11 and the at least thermal conduction structure 14 are placed on the thermal release film 23. The conducting terminals 110 of the electronic component 11 are contacted with the thermal release film 23. Then, as shown in FIG. 2B, the first insulation layer 10 is laminated on the thermal release film 23. Consequently, the electronic component 11 and the at least one thermal conduction structure 14 are covered by the first insulation layer 10. Consequently, the conducting terminals 110 of the electronic component 11 are exposed to the first insulation layer 10. Meanwhile, the semi-package unit 1 is fabricated.

Figure 3:
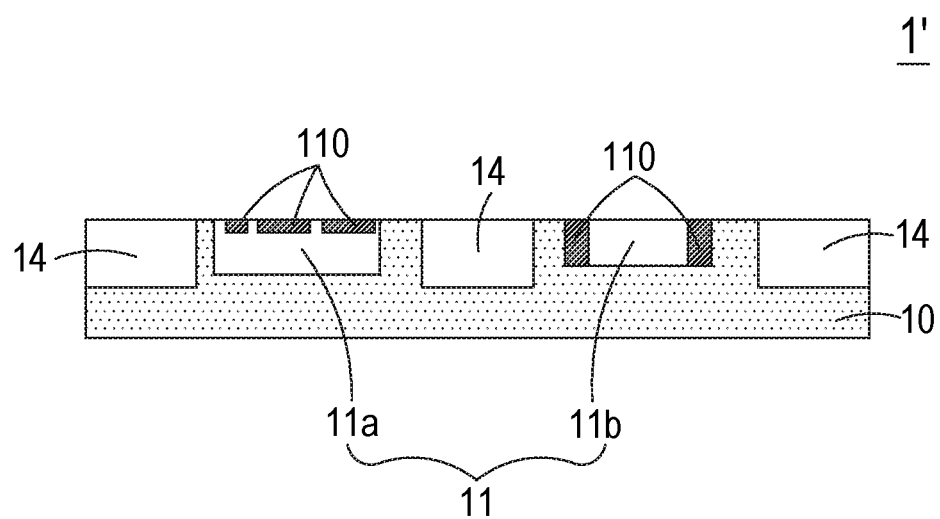
FIG. 3 is a schematic view showing another exemplary semi-package unit employed in the packaging process of the present invention.

FIG. 3 is a schematic view showing another exemplary semi-package unit employed in the packaging process of the present invention. In comparison with the semi-package unit 1 shown in FIGS. 1A and 2C, the semi-package unit 1' of this embodiment comprises plural electronic components 11. The structures of the plural electronic components 11 may be identical or different. For example, as shown in FIG. 3, the semi-package unit 1' comprises two electronic components 11a and 11b. The number of the conducting terminals 110 of each electronic component 11 is determined according to the type of the electronic component 11. For example, the first electronic component 11a is an integrated circuit (IC) chip. The number of the conducting terminals 110 of the first electronic component 11a may be determined according to the configuration of the IC chip. For example, the first electronic component 11a has three conducting terminals 110. Moreover, the second electronic component 11b has two conducting terminals 110. For example, the second electronic component 11b is a capacitor, a resistor, a diode or any other appropriate passive component. It is noted that the number of the electronic component 11 within the semi-package unit 1' may be varied according to the practical requirements.

Moreover, the semi-package unit 1' comprises plural thermal conduction structures 14. In this embodiment, every two thermal conduction structures 14 are horizontally located at bilateral sides of every electronic component 11. That is, one thermal conduction structure 14 is arranged between every two adjacent electronic components 11. In another embodiment, the thermal conduction structures 14 are integrated as a lead frame with a plurality of openings or holes. Each of holes or openings accommodates one or more electric components 11.

FIGS. 4A~4M are schematic cross-sectional views illustrating a packaging process of an electronic component according to a second embodiment of the present invention. Component parts and elements corresponding to those of the first embodiment are designated by identical numeral references, and detailed descriptions thereof are omitted.

Figure 4A:
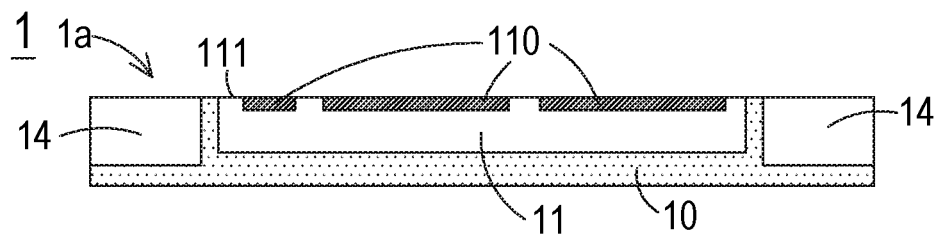
FIGS. 4A~4M are schematic cross-sectional views illustrating a packaging process of an electronic component according to a second embodiment of the present invention.

Firstly, as shown in FIG. 4A, a semi-package unit 1 is provided. The semi-package unit 1 comprises a first insulation layer 10 and an electronic component 11. The electronic component 11 is partially embedded within the first insulation layer 10. Moreover, the electronic component 11 comprises at least one conducting terminal 110. The conducting terminal 110 is disposed on a surface 111 of the electronic component 11 and exposed to the first insulation layer 10. In other words, the conducting terminal 110 is disposed on a surface 1a of the semi-package unit 1. In this embodiment, the electronic component 11 comprises plural conducting terminals 110, and the plural conducting terminals 110 are made of aluminum, silver, gold, or any other appropriate metallic material (e.g. copper). In an embodiment, the semi-package unit 1 further comprises at least one thermal conduction structure 14. The thermal conduction structure 14 is embedded within the first insulation layer 10. Moreover, the thermal conduction structure 14 is located at least a side of the electronic component 11.

Figure 4B:
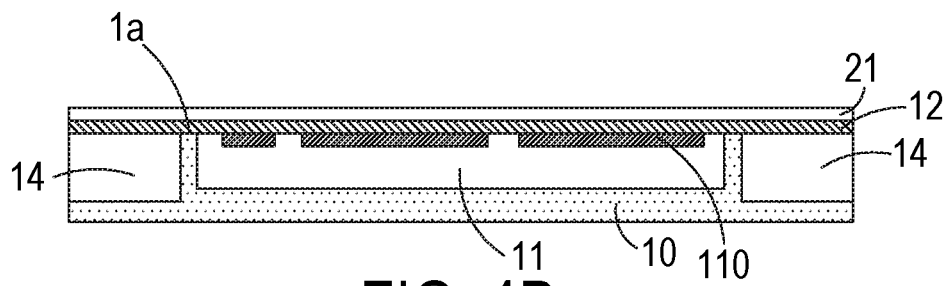

Then, as shown in FIG. 4B, a metal layer 12 is formed on the surface 1a of the semi-package unit 1 to cover the conducting terminals 110, the first insulation layer 10, the surface 111 of the electronic component 11 and the thermal conduction structure 14. In an embodiment, the metal layer 12 is formed by depositing a metal layer, such as a copper (Cu) layer, a TiW/Cu layer, a NiCr/Cu layer or a combination thereof, on the surface 1a of the semi-package unit 1. Then, a photoresist layer 21 is formed on the metal layer 12.

Figure 4C:
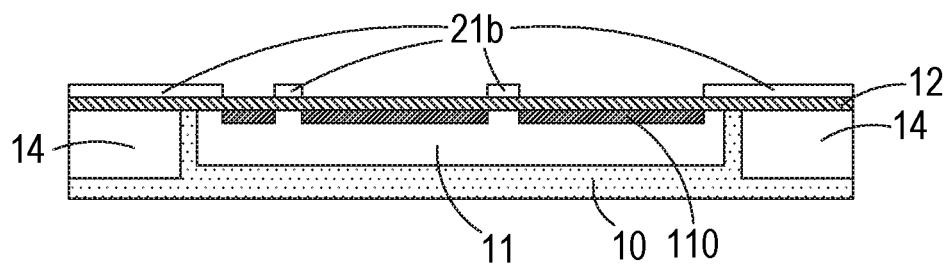

Then, as shown in FIG. 4C, exposure and developing processes are performed to remove a part of the photoresist layer 21 and define a patterned photoresist zone 21b with a photomask (not shown). Consequently, a part of the metal layer 12 is exposed. The part of the metal layer 12 corresponding to the conducting terminals 110 is uncovered by the patterned photoresist zone 21b.

Figure 4D:
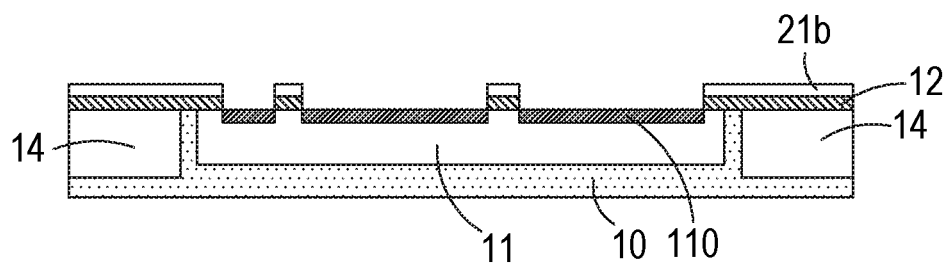

Then, as shown in FIG. 4D, the part of the metal layer 12 uncovered by the patterned photoresist zone 21b is removed. Consequently, the conducting terminals 110 are exposed.

Figure 4E:
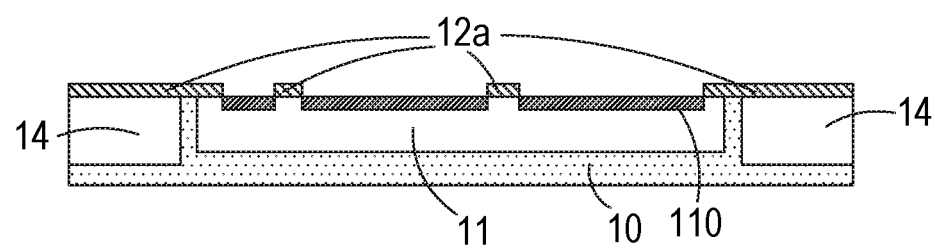
Figure 4F:
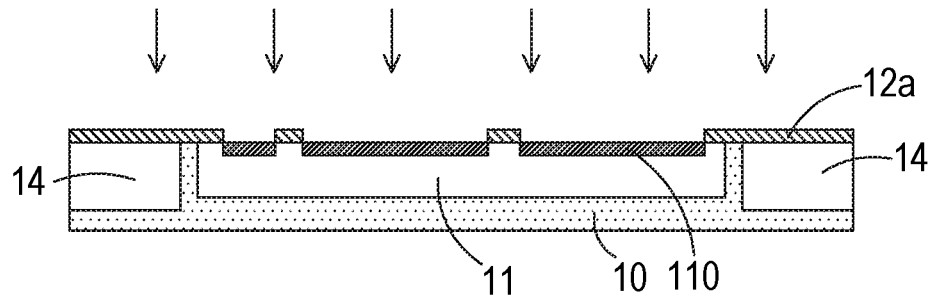
Figure 4G:
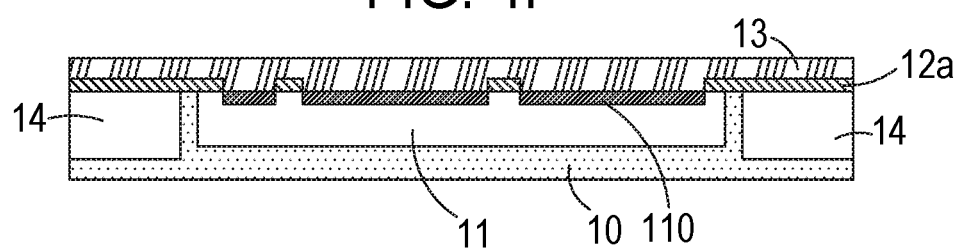
Figure 4H:
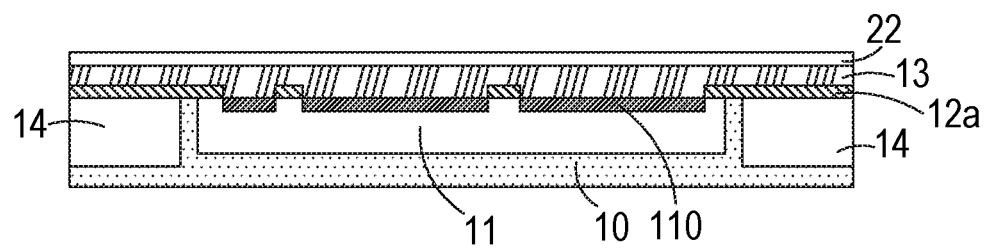
Figure 4I:
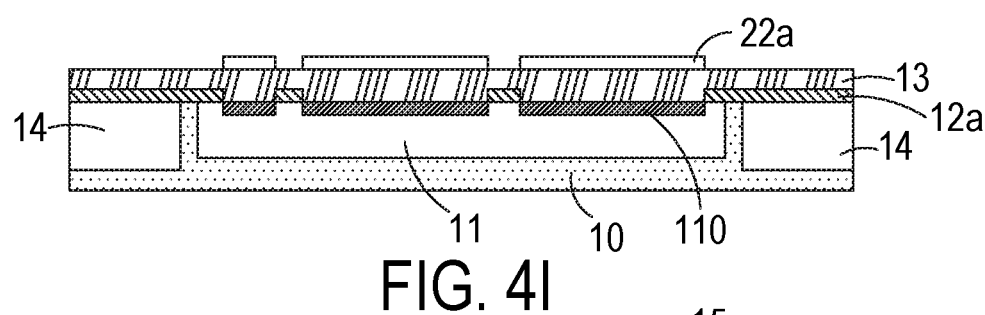
Figure 4J:
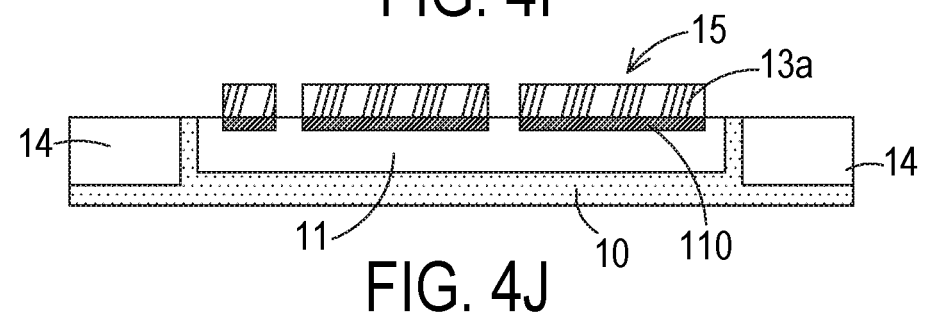
Figure 4K:
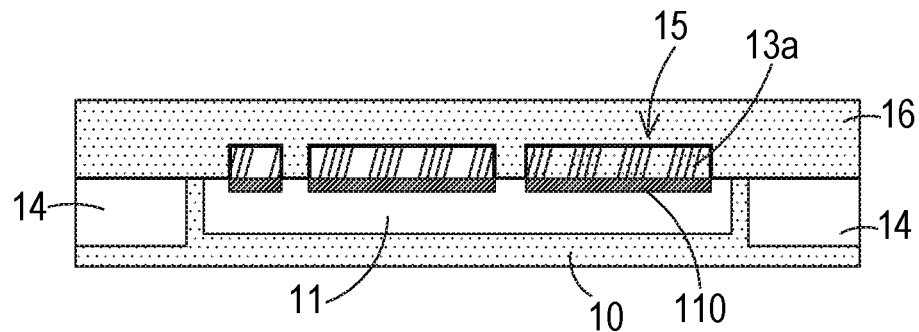
Figure 4L:
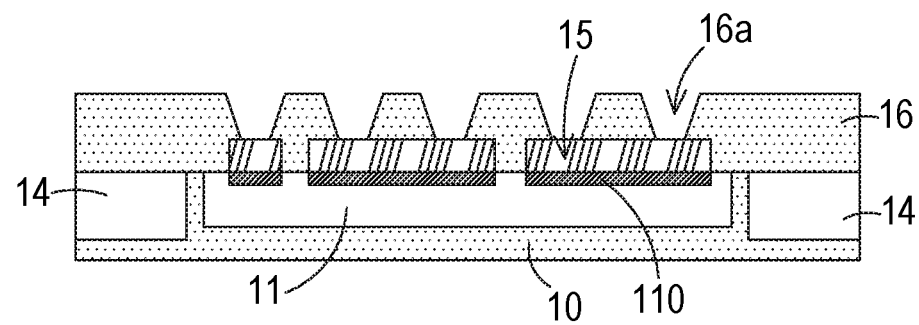
Figure 4M:
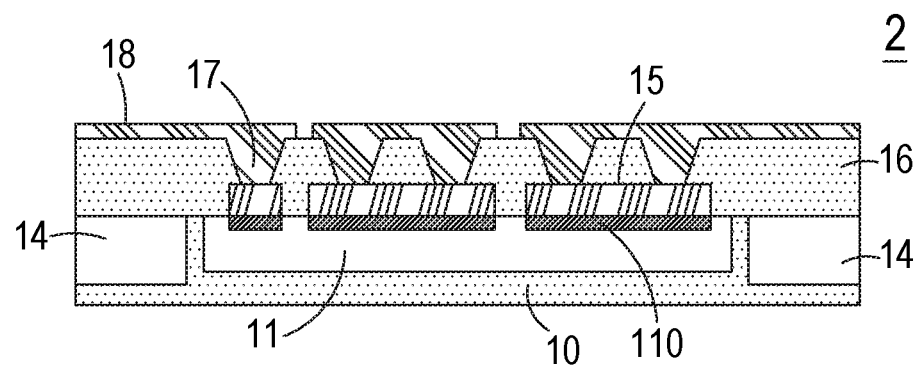

Then, as shown in FIG. 4E, the patterned photoresist zone 21b is removed. The remaining metal layer 12 is defined as a metal mask 12a.

The following steps as shown in FIGS. 4F~4M are similar to the steps as shown in FIGS. 1F~1M, and are not redundantly described herein.

From the above descriptions, the present invention provides a packaging process of an electronic component. The conducting terminals of the electronic component may be made of a non-copper metallic material. Since the type of the electronic component is not stringently limited, the applications of the power module with the package structure of the present invention are more extensive. Moreover, by the packaging process of the present invention, plural panel-level contact pads are formed on the conducting terminals of the electronic component. Due to the panel-level contact pads, the subsequent steps of the embedded package structure (e.g. the laminating process, the laser drilling process, the desmearing process and the blind via plating process) can be successfully done. Moreover, since the conducting terminals uncovered by the metal mask are subjected to a plasma cleaning process, the native oxide material and the contaminant formed on the conducting terminals are cleaned off.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A packaging process of an electronic component, the packaging process comprising steps of:
   (a) providing a semi-package unit comprising a first insulation layer and an electronic component, wherein the electronic component is partially embedded within the first insulation layer, the electronic component comprises at least one conducting terminal disposed on a surface of the semi-package unit without being covered by the first insulation layer;
   (b) forming a metal layer over the surface of the semi-package unit and removing a part of the metal layer, so that a metal mask is formed on the surface of the semi-package unit and the at least one conducting terminal uncovered by the metal mask is exposed;
   (c) forming a metal re-distribution layer on the metal mask and the at least one conducting terminal, so that the metal mask and the at least one conducting terminal is covered by and contacted with the metal re-distribution layer; and
   (d) removing a part of the metal re-distribution layer and a part of the metal mask, so that at least one contact pad corresponding to the at least one conducting terminal is produced;
   wherein the step (b) comprises sub-steps of:
   forming the metal layer to cover the first insulation layer, the electronic component and at least one thermal conduction structure of the semi-package unit;
   forming a photoresist layer on the metal layer;
   performing exposure and developing processes to remove a part of the photoresist layer, thereby defining a patterned photoresist zone, wherein a part of the metal layer corresponding to the at least one conducting terminal is uncovered by the patterned photoresist zone;
   removing the part of the metal layer uncovered by the patterned photoresist zone, so that the at least one conducting terminal is exposed; and
   removing the patterned photoresist zone, so that the metal mask is produced.

2. The packaging process according to claim 1, wherein the conducting terminal is made of a non-copper metallic material.

3. The packaging process according to claim 1, wherein the semi-package unit comprises at least one thermal conduction structure, the at least one thermal conduction structure is partially embedded within the first insulation layer, and located at a side of the electronic component.

4. The packaging process according to claim 3, wherein the step (a) comprises sub-steps of:
   providing a release film, and placing the electronic component and the at least one thermal conduction structure on the release film, wherein the at least one conducting terminal of the electronic component is contacted with the release film;
   laminating the first insulation layer on the release film, so that the electronic component and a part of the thermal conduction structure are covered by the first insulation layer; and
   removing the release film, so that the at least one conducting terminal of the electronic component is exposed to the first insulation layer and the semi-package unit is produced.

5. The packaging process according to claim 1, wherein after the step (b), the at least one conducting terminal uncovered by the metal mask is further subjected to a plasma cleaning process.

6. The packaging process according to claim 1, wherein in the step (c), the metal re-distribution layer is formed by a depositing process or an electroplating process.

7. The packaging process according to claim 1, wherein the metal re-distribution layer is made of copper or a copper-containing material.

8. The packaging process according to claim 1, wherein the step (d) comprises sub-steps of:
   forming a photoresist layer on the metal re-distribution layer;
   performing exposure and developing processes to remove a part of the photoresist layer, thereby defining a patterned photoresist zone corresponding to the at least one conducting terminal, wherein a part of the metal re-distribution layer uncovered by the patterned photoresist zone is exposed;
   performing an etching process to remove the part of the metal re-distribution layer uncovered by the patterned photoresist zone and the metal mask; and
   removing the patterned photoresist zone, thereby producing the at least one contact pad corresponding to the at least one conducting terminal, wherein the conducting terminal and the corresponding contact pad are collaboratively defined as an electrode.

9. The packaging process according to claim 1, wherein after the step (d), the packaging process further comprises steps of:
   forming a second insulation layer to cover the at least one contact pad, the electronic component, and the first insulation layer;
   performing a laser drilling process to form at least one opening in the second insulation layer at location corresponding to the at least one contact pad;

performing a desmearing process to treat the at least one opening, wherein the at least one contact pad is exposed through the corresponding opening;

performing a plating process to fill a conductive material in the at least one opening, so that plural conductive vias and a metal line is formed.

\* \* \* \* \*